United States Patent
Chen et al.

(10) Patent No.: US 7,375,541 B1
(45) Date of Patent: May 20, 2008

(54) TESTING METHOD UTILIZING AT LEAST ONE SIGNAL BETWEEN INTEGRATED CIRCUITS, AND INTEGRATED CIRCUIT AND TESTING SYSTEM THEREOF

(75) Inventors: Yi-Chuan Chen, Taipei (TW); Hong-Ching Chen, Kao-Hsiung Hsien (TW)

(73) Assignee: MediaTek Inc., Hsin-Chu Hsien (TW)

( * ) Notice: Subject to any disclaimer, the term of this patent is extended or adjusted under 35 U.S.C. 154(b) by 109 days.

(21) Appl. No.: 11/164,028

(22) Filed: Nov. 8, 2005

(51) Int. Cl.
*G01R 31/26* (2006.01)
(52) U.S. Cl. ..................... 324/763; 324/765
(58) Field of Classification Search ............ None
See application file for complete search history.

(56) References Cited

U.S. PATENT DOCUMENTS 6,721,913 B1 * 4/2004 Azimi ................... 714/734
6,825,683 B1 * 11/2004 Berndt et al. ............ 324/763

* cited by examiner

*Primary Examiner*—Minh N. Tang
(74) *Attorney, Agent, or Firm*—Winston Hsu

(57) ABSTRACT

A testing method utilizing at least one signal between ICs includes: coupling at least one testing device to a plurality of ICs that are capable of being tested by the testing device, the ICs including at least a first IC and a second IC; coupling the second IC to the first IC to utilize at least one output signal of the first IC to be at least one input signal of the second IC; and testing the second IC by utilizing the testing device and the output signal of the first IC.

17 Claims, 6 Drawing Sheets

TESTING METHOD UTILIZING AT LEAST
ONE SIGNAL BETWEEN INTEGRATED
CIRCUITS, AND INTEGRATED CIRCUIT
AND TESTING SYSTEM THEREOF

BACKGROUND

The present invention relates to integrated circuit (IC) testing, and more particularly, to a testing method utilizing at least one signal between ICs (integrated circuits), and ICs and testing systems thereof.

Please refer to FIG. 1. FIG. 1 illustrates a diagram of an IC 20 to be tested by an Automatic Test Equipment (ATE) 10 according to the related art, where the IC 20 is utilized for controlling operations of an electronic device (not shown), such as an optical disc drive. To ensure that the function of IC 20 is correct, it is necessary to perform IC testing of the IC 20, especially in a mass production phase.

As illustrated in FIG. 1, a testing circuit 12 (the shaded portion shown in FIG. 1), usually containing a socket, is utilized for coupling the IC 20 to the ATE 10. When performing IC testing of the IC 20, the ATE 10 sends test signals in the specific input pins of IC 20. According to the received signals from the specific output pins of IC 20, the ATE determines whether the function of IC 20 is correct or not. The conventional testing system based on the ATE 10 is usually expensive that causes the high testing cost of IC 20.

Please refer to FIG. 2. FIG. 2 illustrates a testing system for performing a system level test (SLT) of the IC 20 shown in FIG. 1. The SLT is also known as the on-board test, which means the IC 20 is tested in a test environment that is the same as the actual work environment of the IC 20, such as the optical disc drive mentioned above. As shown in FIG. 2, the testing system comprises a circuit board 30, typically the same as that utilized in the optical disc drive. The circuit board 30 comprises a testing circuit 32 usually containing the socket mentioned above, for coupling the IC 20. The circuit board 30 further comprises a DRAM 34, a FLASH memory 36, and an intermediate circuit 38 for coupling a loader 40 including at least a spindle motor 42 and an optical pickup (OPU) 44. A disc 60 such as a Compact Disc (CD) or a Digital Versatile Disc (DVD), together with a Personal Computer (PC) 80 (which is sometimes replaced by an external controlling circuit) are typically provided to simulate the environment of an end user of the optical disc drive.

During the SLT, the first step is to load the IC 20 in the testing circuit 32. In the second step, the power of the testing system shown in FIG. 2 is turned on, and the initialization of the testing system starts to run. In the coming steps, various functionalities can be tested according to predetermined order. For example, one step is that the PC 80 requests mechanical movements of the loader 40. In another step, the communication between the IC 20 and some of the other components on the circuit board 30 can be verified. Besides, accessing data to/from the disc 60 through the OPU 44 can be further performed. The disadvantage of SLT is large test cost due to the long test time, and the long time is caused by the response time of electronic components, mechanical movements such as those of a disc tray (not shown) driven by the motor 42 and those of the OPU 44, ... etc., where the mechanical movements especially take considerable time.

SUMMARY

It is an objective of the claimed invention to provide testing methods utilizing at least one signal between integrated circuits (ICs) that are capable of being tested, and ICs and testing systems thereof.

An exemplary embodiment of a testing method utilizing at least one signal between ICs comprises: coupling at least one testing device to a plurality of ICs that are capable of being tested by the testing device, the ICs comprising a first IC and a second IC; coupling the second IC to the first IC to utilize at least one output signal of the first IC to be at least one input signal of the second IC; and testing the second IC by utilizing the testing device and the output signal of the first IC.

An exemplary embodiment of a testing method utilizing at least one signal between ICs comprises: within each of a plurality of ICs that are capable of being tested by at least one testing device, providing a signal generation unit, where the ICs comprising a first IC and a second IC; coupling the testing device to the ICs; coupling the second IC to the first IC to utilize at least one output signal generated by the signal generation unit of the first IC to be at least one input signal of the second IC; and testing the second IC by utilizing the testing device and the output signal generated by the signal generation unit of the first IC.

An exemplary embodiment of an IC applicable to an electronic device comprises: a control circuit for controlling the electronic device; and a signal generation unit coupled to the control circuit for generating at least one signal to another IC for testing.

An exemplary embodiment of a testing system comprises at least one testing device and a plurality of ICs that are capable of being tested by the testing device. The ICs are coupled to the testing device. Each of the ICs is applicable to an electronic device and comprises: a control circuit for controlling the electronic device; and a signal generation unit coupled to the control circuit for generating at least one signal to one of the other IC(s) for testing.

These and other objectives of the claimed invention will no doubt become obvious to those of ordinary skill in the art after reading the following detailed description of the preferred embodiment that is illustrated in the various figures and drawings.

Certain terms are used throughout the following description and claims to refer to particular system components. As one skilled in the art will appreciate, consumer electronic equipment manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

Figure 1:
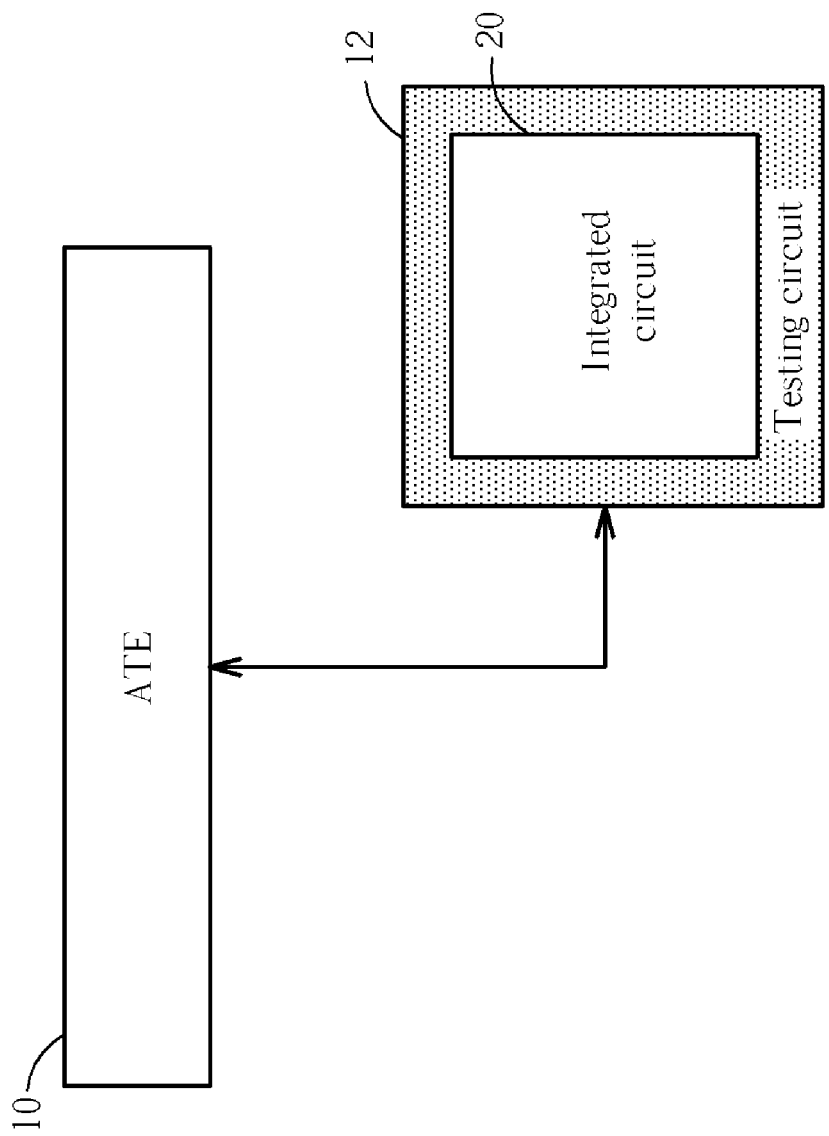
FIG. 1 illustrates a diagram of an integrated circuit (IC) to be tested by an Automatic Test Equipment (ATE) according to the related art.
Figure 3:
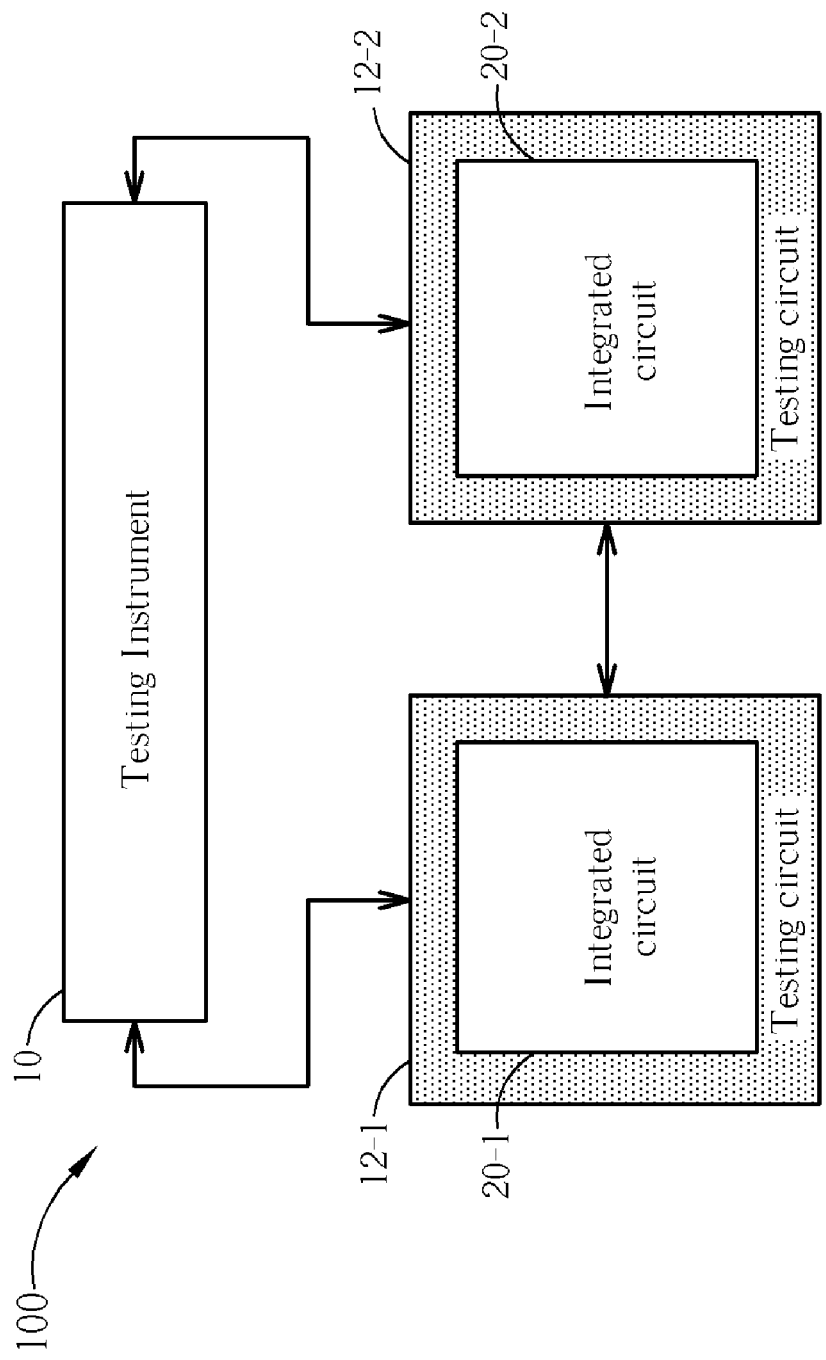
FIG. 3 is a diagram of a testing system according to one embodiment of the present invention.

Please refer to FIG. 3. FIG. 3 is a diagram of a testing system 100 according to one embodiment of the present invention. The testing system 100 comprises at least one testing device, which comprises the ATE 10 shown in FIG. 1. The testing system 100 further comprises integrated circuits (ICs) 20-1 and 20-2 that are capable of being tested by the ATE 10, and testing circuits 12-1 and 12-2 (the shaded portion shown in FIG. 3) containing sockets for coupling the ICs 20-1 and 20-2 to the ATE 10 respectively.

According to this embodiment, a testing method of the present invention comprises utilizing at least one signal between ICs 20-1 and 20-2. In order to test the IC 20-2 in an IC testing procedure, at least one output signal of the IC 20-1 is utilized to be at least one input signal of the IC 20-2, and the IC 20-2 is tested by utilizing the ATE 10 and the output signal of the IC 20-1. For example, the ICs 20-1 and 20-2 are applicable to electronic devices such as optical disc drives of the same kind, and a writing signal of the IC 20-1 is selected to be the output signal to be transmitted to the IC 20-2. The IC 20-2 utilizes the writing signal to be an RF signal to be read by a reading channel of the IC 20-2. For example, the writing signal can be the recording channel bit signal (which is generated from the IC 20-1) for recording the user data onto a CD/DVD disc, and this recording channel bit signal is taken by the IC 20-2 as an RF signal read from a CD/DVD disc, where the recording channel bit signal is utilized for producing the recorded channel bit(s) corresponding to the user data. As at least one input/output (I/O) pin of the IC 20-1 and at least one I/O pin of the IC 20-2 are not needed to be coupled to the ATE 10, the number of I/O ports of the ATE 10 can be saved for further use. Here, if the IC 20-2 correctly responds to the RF signal, which is the writing signal generated by the IC 20-1, both of the writing function of the IC 20-1 and the reading function of the IC 20-2 can be determined to be qualified in the IC testing procedure. That is, the ICs 20-1 and 20-2 are tested at the same time by taking a testing result of the IC 20-2 as a testing result of the IC 20-1.

According to the architecture shown in FIG. 3, utilizing at least one output signal of the IC 20-2 to be at least one input signal of the IC 20-1 can be performed. The IC 20-1 can be tested by utilizing the ATE 10 and the output signal of the IC 20-2. For example, the IC 20-1 utilizes a writing signal outputted from the IC 20-2 to be an RF signal to be read by a reading channel of the IC 20-1. As a result, mutual testing of the ICs 20-1 and 20-2 is possible.

Please note that at least one of the IC 20-1 and the IC 20-2 can be in a test mode for being tested or for testing one of the other IC(s) according to different implementation choices. In the test mode of one IC, the IC inputs at least one signal in order to be tested by the ATE 10 according to the at least one signal, or outputs at least one signal for testing one of the other IC(s). In addition to the test mode, the IC may have a normal mode for normal operation (e.g., controlling an electronic device while the IC is applied to the electronic device). For example, the IC 20-2 may have a specialized mode being a test mode for testing the IC 20-2 and another specialized mode being a normal mode for normal operation, and the IC 20-1 may have a specialized mode being a test mode for testing the IC 20-1 and another specialized mode being a normal mode for normal operation. In another example, the IC 20-1 may have a specialized mode being a test mode for testing the IC 20-2 and another specialized mode being a normal mode for normal operation, and the IC 20-2 may have a specialized mode being a test mode for testing the IC 20-1 and another specialized mode being a normal mode for normal operation.

According to the present invention, the IC 20-1 and the IC 20-2 can be the same ICs or different ICs. In this embodiment, the IC 20-1 and the IC 20-2 are the same ICs. It is noted that the ICs 20-1 and 20-2 need not be applicable to the same kind of electronic devices. That is, the ICs 20-1 and 20-2 can be utilized in different kinds of electronic devices. In one example, the IC 20-1 is applicable to a Compact Disc (CD) drive and the IC 20-2 is applicable to a Digital Versatile Disc (DVD) drive that is capable of accessing a CD, so the writing signal outputted from the IC 20-1 can be utilized to be an RF signal to be read by the reading channel of the IC 20-2.

Figure 2:
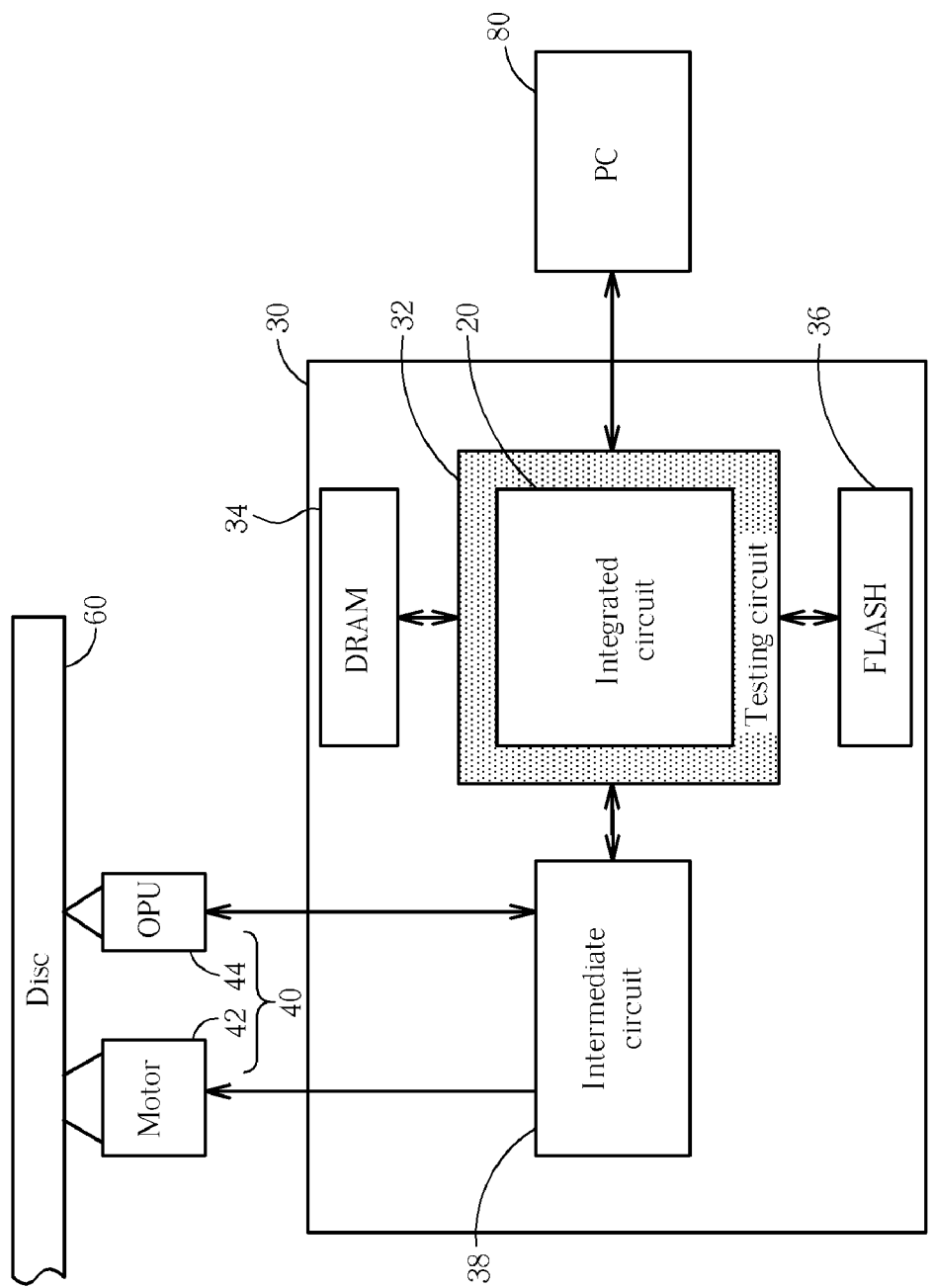
FIG. 2 illustrates a testing system for performing a system level test of the IC shown in FIG. 1.
Figure 4:
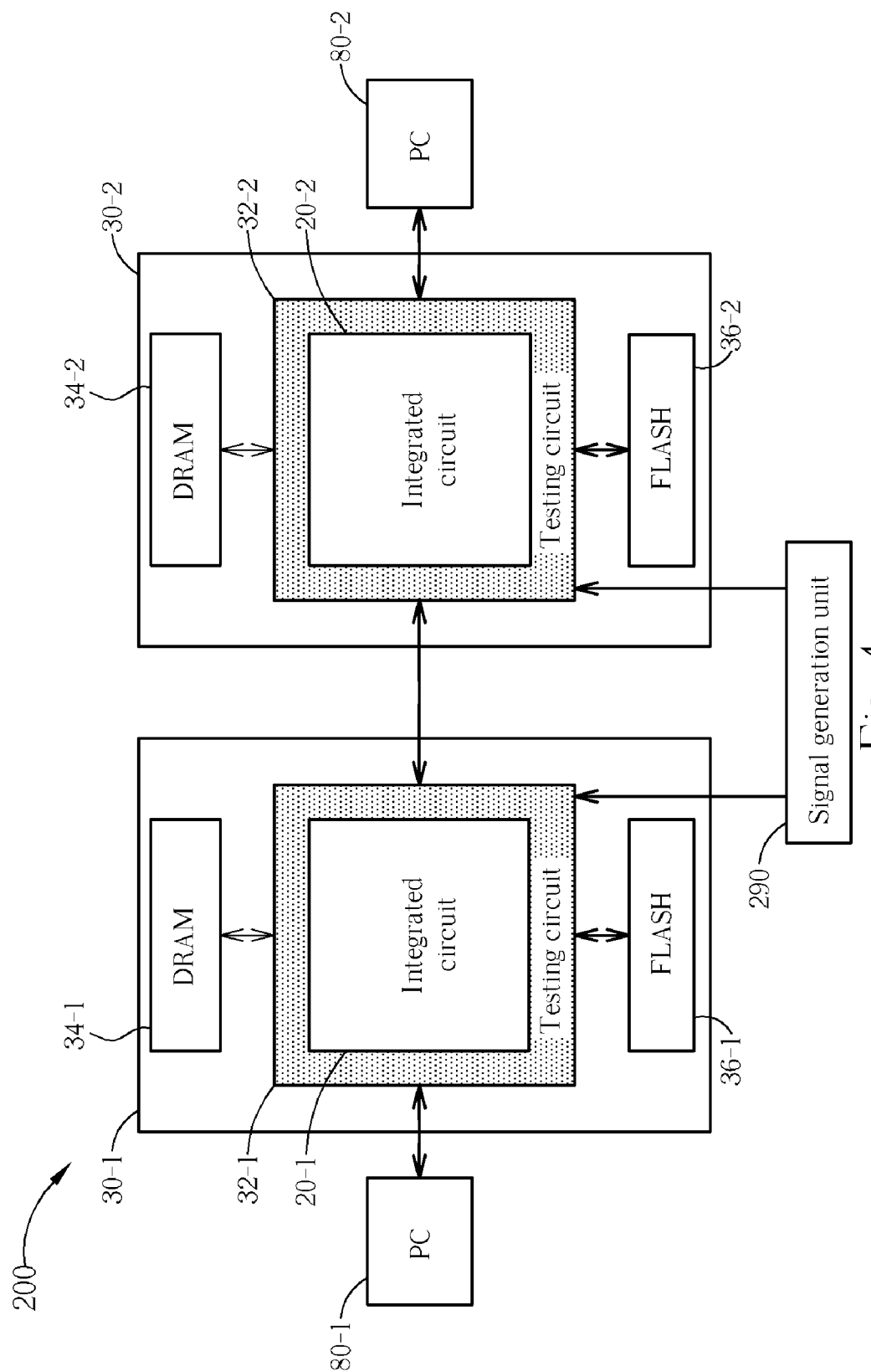
FIG. 4 is a diagram of a testing system according to one embodiment of the present invention.

Please refer to FIG. 4. FIG. 4 is a diagram of a testing system 200 according to one embodiment of the present invention. The architecture shown in FIG. 4 is typically applied to a system level test (SLT) of the IC 20-1 and/or an SLT of the IC 20-2. The testing system 200 comprises circuit boards 30-1 and 30-2, which are similar to the circuit board 30 shown in FIG. 2. Here, the intermediate circuits corresponding to the intermediate circuit 38 shown in FIG. 2 are not illustrated in FIG. 4. In contrast to the architecture shown in FIG. 2, there is no loader attached to either of the circuit boards 30-1 and 30-2. The testing system 200 further comprises a signal generation unit (SGU) 290 to generate at least one signal to be replacement for any signal lost due to detachment of the loader or some other components from either of the circuit boards 30-1 and 30-2. That is, applications of the SGU 290 are not limited to replacing the loader. As the SGU 290 is provided, signals generated by the SGU 290 can be utilized for testing at least one of the ICs 20-1 and 20-2.

Figure 5:
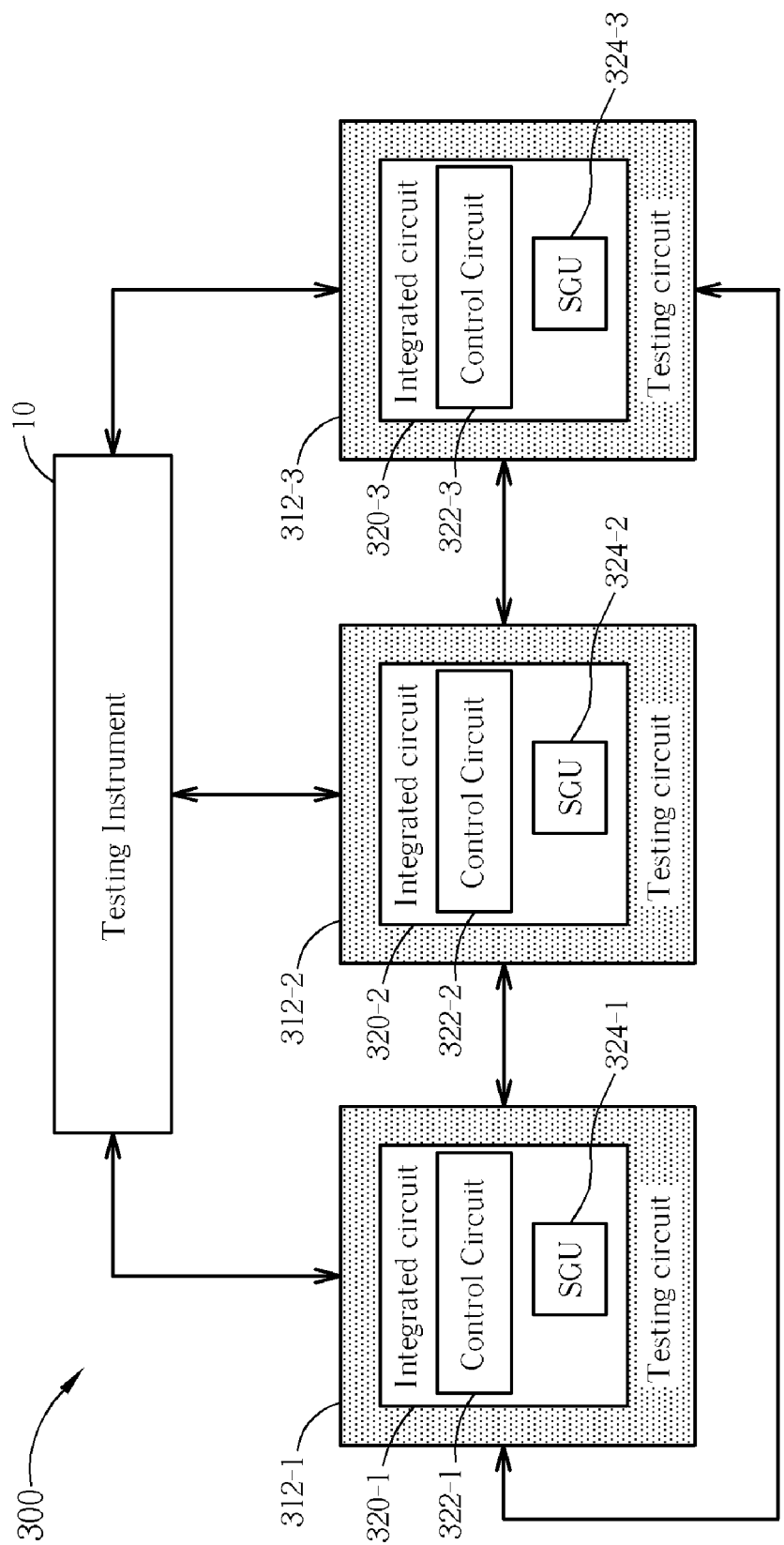
FIG. 5 is a diagram of a testing system according to one embodiment of the present invention.

Please refer to FIG. 5. FIG. 5 is a diagram of a testing system 300 according to a third embodiment of the present invention. The architecture shown in FIG. 5 is typically applied to a functional test. Within the testing system 300, each of the ICs 320-1, 320-2, and 320-3, for example, the IC 320-1, is applicable to an electronic device (e.g. the CD drive or the DVD drive mentioned above) and comprises a control circuit 322-1 for controlling the electronic device while the IC 320-1 is mounted therein. As shown in FIG. 5, each of the ICs 320-1, 320-2, and 320-3, for example, the IC 320-2, further comprises an SGU 324-2 for generating at least one signal being outputted to one of the other ICs, e.g. the IC 320-3, in a test mode of at least one of the two ICs 320-2 and 320-3. As each of the SGUs 324-1, 324-2, 324-3 respectively embedded in the ICs 320-1, 320-2, 320-3 can be utilized for generating at least one signal, for example, a pattern signal, as the output signal of the IC where the SGU is embedded, and as each of the control circuits 322-1, 322-2, 322-3 may generate signal(s) being outputted, each of the ICs 320-1, 320-2, 320-3 may have a plurality of output signals including the pattern signal mentioned above.

According to this embodiment, the ICs 320-1, 320-2, and 320-3 are cascaded in series to utilize at least one output signal of a specific IC as at least one input signal of a IC coupled to the specific IC, where the IC 320-1 is located at a beginning position of the ICs cascaded in series. As the SGUs 324-1, 324-2, and 324-3 can be utilized for generating signals as replacement for any signal provided by circuit boards such as the circuit boards 30-1 and 30-2 shown in FIG. 4, at least a portion of the system level test (SLT) performed in the testing system 200 is available in this embodiment. Thus, it is available to test any of the ICs 320-1, 320-2, and 320-3 by utilizing the ATE 10 and at least one output signal of another IC from the ICs 320-1, 320-2, and 320-3, and more particularly, utilizing at least one output signal generated by the SGU of another IC from the ICs 320-1, 320-2, and 320-3. As the SGUs 324-1, 324-2, and 324-3 can be designed to generate signals for replacing at least a portion of signals outputted from the ATE 10, the SGUs 324-1, 324-2, and 324-3 may take charge of a portion of functionalities of the ATE 10.

In addition to utilizing a writing signal of one IC as an RF signal to be read by a reading channel of another IC, utilizing interface signals between ICs can be implemented according to the architecture shown in FIG. 5. For example, the SGU 324-3 generates at least one Serial ATA (SATA) signal as an output signal of the IC 320-3, where the SATA signal is utilized as at least one input signal of the IC 320-1, and further utilized for testing the control circuit 322-1 of the IC 320-1.

In an extreme case, the architecture shown in FIG. 5 can be utilized for simulating an SLT, since the SGUs 324-1, 324-2, and 324-3 can be designed to generate signals needed in the SLT.

Similarly, according to the present invention, two of the IC 320-1, the IC 320-2, and the IC 320-3 can be the same ICs or different ICs. In this embodiment, the IC 320-1, the IC 320-2, and the IC 320-3 are the same ICs. Additionally, at least one of the IC 320-1, the IC 320-2, and the IC 320-3 can be in a test mode for being tested or for testing one of the other ICs according to different implementation choices of the present invention. For example, each of the IC 320-1, the IC 320-2, and the IC 320-3, e.g., the IC 320-1, may have a specialized mode being a test mode for testing one of the other ICs with the SGU 324-1 enabled, and another specialized mode being a normal mode for normal operation with the SGU 324-1 disabled. In another example, each of the IC 320-1, the IC 320-2, and the IC 320-3, e.g., the IC 320-1, may have a specialized mode being a test mode for being tested with the SGU 324-1 either enabled (for mutual testing) or disabled (for testing the IC 320-1), and another specialized mode being a normal mode for normal operation with the SGU 324-1 disabled.

Figure 6:
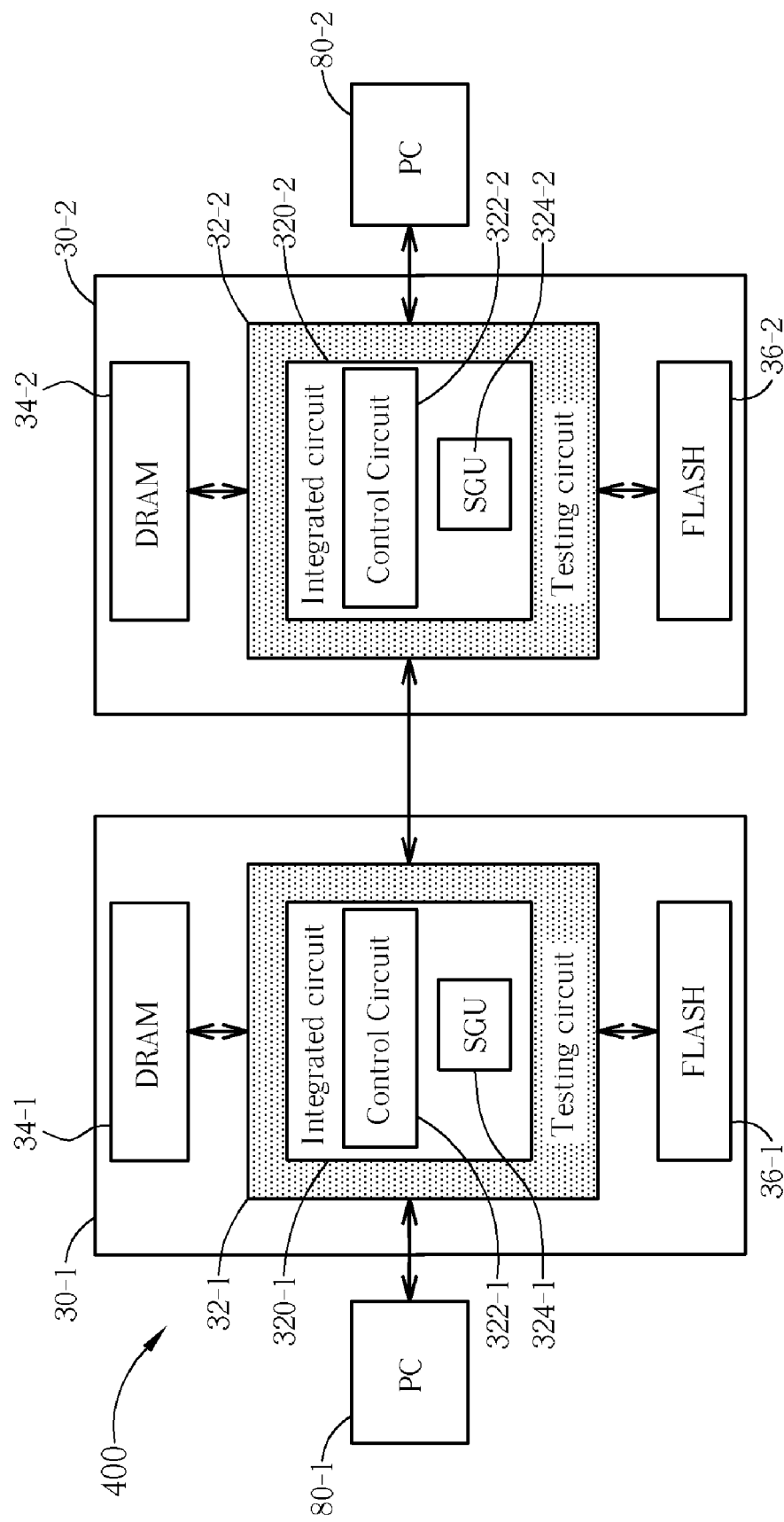
FIG. 6 is a diagram of a testing system according to one embodiment of the present invention.

Please refer to FIG. 6. FIG. 6 is a diagram of a testing system 400 according to one embodiment of the present invention. The architecture shown in FIG. 6 is typically applied to an SLT of the IC 320-1 and/or an SLT of the IC 320-2. As the SGUs 324-1 and 324-2 can be utilized for generating signals as replacement for any signal lost due to detachment of the loader from any of the circuit board 30-1 and 30-2, the SLT of at least one of the ICs 320-1 and 320-2 can be performed as mentioned.

In contrast to the related art, the testing methods and related devices of the present invention utilize signals between the ICs, so the I/O ports of testing devices such as the ATE 10 can be saved for further use. In addition, as the SGUs in the ICs of the present invention can be utilized for generating signals as needed, corresponding testing costs are greatly reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A testing method utilizing at least one signal between ICs, comprising:
   coupling a first IC and a second IC to at least one testing device;
   generating at least one signal inside the first IC as an output signal;
   coupling the second IC to the first IC to utilize the output signal of the first IC to be at least one input signal of the second IC; and
   testing the second IC by utilizing the testing device and the output signal of the first IC.

2. The testing method of claim 1, wherein the first IC and the second IC are the same ICs.

3. The testing method of claim 1, wherein the step of coupling the second IC to the first IC further comprises:
   generating at least one signal inside the second IC as an output signal;
   utilizing the output signal of the second IC to be at least one input signal of the first IC, and the testing method further comprises:
   testing the first IC by utilizing the testing device and the output signal of the second IC.

4. The testing method of claim 1, wherein at least one of the first IC and the second IC is in a test mode.

5. The testing method of claim 1, wherein the first and second ICs are capable of being utilized in different kinds of electronic devices.

6. The testing method of claim 1, wherein the first and second ICs are applicable to optical disc drives, and the output signal of the first IC comprises a writing signal.

7. The testing method of claim 1, wherein the first and second ICs are applicable to optical disc drives, and the output signal of the first IC comprises at least one interface signal.

8. The testing method of claim 1, further comprising:
   providing a signal generation unit embedded in the first IC to generate a pattern signal as the output signal of the first IC.

9. The testing method of claim 1, further comprising:
   providing a signal generation unit positioned outside the first and second ICs to generate at least one signal for testing at least one of the first and second ICs.

10. A testing method utilizing at least one signal between ICs, comprising:
    coupling a first IC and a second IC to at least one testing device, wherein the first IC comprises a first signal generation unit;
    utilizing the first signal generation unit to generate at least one signal as an output signal of the first IC;
    coupling the second IC to the first IC to utilize the output signal of the first IC to be at least one input signal of the second IC; and
    testing the second IC by utilizing the testing device and the output signal generated by the first signal generation unit of the first IC.

11. The testing method of claim 10, wherein the first IC and the second IC are the same ICs.

12. The testing method of claim 10, wherein the second IC further comprises a second signal generation unit, and the step of coupling the second IC to the first IC further comprises:

utilizing the second signal generation unit to generate at least one signal inside the second IC as an output signal; and utilizing the output signal of the second IC to be at least one input signal of the first IC, and the testing method further comprises:

testing the first IC by utilizing the testing device and the output signal generated by the second signal generation unit of the second IC.

13. The testing method of claim 10, wherein at least one of the first IC and the second IC is in a test mode.

14. The testing method of claim 10, wherein the first and second ICs are utilized in different kinds of electronic devices.

15. The testing method of claim 10, wherein the first and second ICs are applicable to optical disc drives.

16. The testing method of claim 1, further comprising testing the first IC according to a result of the second IC.

17. The testing method of claim 10, further comprising testing the first IC according to a result of the second IC.

* * * * *